United States Patent
Paul et al.

(10) Patent No.: US 10,510,392 B1
(45) Date of Patent: Dec. 17, 2019

(54) INTEGRATED CIRCUITS HAVING MEMORY CELLS WITH SHARED BIT LINES AND SHARED SOURCE LINES

(71) Applicant: GLOBALFOUNDRIES, Inc., Grand Cayman (KY)

(72) Inventors: Bipul C. Paul, Malta, NY (US); Akhilesh Jaiswal, Malta, NY (US); Ajey Poovannummoottil Jacob, Malta, NY (US); William Taylor, Malta, NY (US); Danny Pak-Chum Shum, Malta, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 16/047,882

(22) Filed: Jul. 27, 2018

(51) Int. Cl.
G11C 11/16 (2006.01)

(52) U.S. Cl.
CPC ...... *G11C 11/1655* (2013.01); *G11C 11/1659* (2013.01); *G11C 11/1673* (2013.01); *G11C 11/1675* (2013.01)

(58) Field of Classification Search
CPC .............................. G11C 11/1655; G11C 7/18
USPC ................................................... 365/158, 63
See application file for complete search history.

(56) References Cited

U.S. PATENT DOCUMENTS

| | | | |
|---|---|---|---|
| 7,187,577 B1* | 3/2007 | Wang | G11C 11/16 365/148 |
| 7,324,366 B2* | 1/2008 | Bednorz | G11C 8/14 365/100 |
| 7,423,898 B2* | 9/2008 | Tanizaki | G11C 11/56 365/148 |
| 7,505,307 B2* | 3/2009 | Ueda | G11C 7/02 365/158 |
| 8,174,874 B2* | 5/2012 | Inaba | G11C 7/18 365/148 |
| 8,213,216 B2* | 7/2012 | Wang | G11C 7/18 365/100 |
| 8,233,310 B2* | 7/2012 | Fujita | G11C 11/1659 365/148 |
| 8,432,727 B2* | 4/2013 | Ryu | G11C 11/1675 365/148 |
| 8,498,144 B2* | 7/2013 | Takahashi | G11C 8/08 365/148 |

(Continued)

OTHER PUBLICATIONS

Gupta et al., "Layout-Aware Optimization of STT MRAMs", School of Electrical and Computer Engineering, Purdue University, 4 pages, publication date: Mar. 2012.

(Continued)

*Primary Examiner* — Son L Mai
(74) *Attorney, Agent, or Firm* — Yee Lim; Hoffman Warnick LLC

(57) ABSTRACT

Integrated circuits, memory arrays and methods for operating integrated circuit devices are provided. In an embodiment, an integrated circuit includes a selected column of bit cells, wherein each bit cell in the selected column is coupled to a source line and coupled to a bit line. Further, the integrated circuit includes a first column of bit cells laterally adjacent the selected column, wherein each bit cell in the first column is coupled to the source line. Also, the integrated circuit includes a second column of bit cells laterally adjacent the selected column, wherein each bit cell in the second column is coupled to the bit line.

18 Claims, 4 Drawing Sheets

(56) References Cited

U.S. PATENT DOCUMENTS

| | | | |
|---|---|---|---|
| 9,281,344 B2* | 3/2016 | Lee | H01L 27/228 |
| 9,299,392 B2* | 3/2016 | Lee | G11O 5/063 |
| 9,786,343 B1 | 10/2017 | DeBrosse | |
| 10,121,826 B1* | 11/2018 | Chen | H01L 27/2436 |
| 2006/0209585 A1* | 9/2006 | Tanizaki | G11C 11/56 |
| | | | 365/148 |

OTHER PUBLICATIONS

Shafaei et al., "Low Write-Energy STT-MRAMs using FinFET-based Access Transistors" Department of Electrical Engineering, 6 pages, publication date: Oct. 2014.

* cited by examiner

INTEGRATED CIRCUITS HAVING MEMORY CELLS WITH SHARED BIT LINES AND SHARED SOURCE LINES

TECHNICAL FIELD

The technical field generally relates to integrated circuits, and more particularly relates to integrated circuits with memory arrays in which bit lines and source lines are shared.

BACKGROUND

A magnetic memory cell may store information by changing electrical resistance of a magnetic tunnel junction (MTJ) element. The MTJ element typically includes a thin insulating tunnel barrier layer sandwiched between a magnetically fixed layer and a magnetically free layer, forming a magnetic tunnel junction. Magnetic orientations of the fixed and free layers may be perpendicular to the growth direction, forming a perpendicular MTJ (or pMTJ) element.

Spin transfer torque (STT) or spin transfer switching, uses spin-aligned ("polarized") electrons to directly apply a torque on the MTJ layers. Specifically, when electrons flowing into a layer have to change spin direction, a torque is developed and is transferred to the nearby layer.

Magnetic memory cells are typically provided as addressable bit cells in an array of columns and rows. Such an array is provided with corresponding source lines, bit lines and word lines to perform operations on selected bit cells. Typically, each column of memory cells is provided with a dedicated source line and a dedicated bit line. As technology scales, there is difficulty in reducing the amount of chip area and height used by such memory cell arrays.

In view of the foregoing, it is desirable to provide an integrated circuit having memory cells that use a reduced amount of chip area and/or height, as compared to conventional layouts. Furthermore, it is also desirable to provide a memory array in which certain adjacent columns of memory cells share a bit line and other adjacent columns of memory cells share a source line. Furthermore, other desirable features and characteristics will become apparent from the subsequent detailed description and the appended claims, taken in conjunction with the accompanying drawings and this background.

BRIEF SUMMARY

Integrated circuits, memory arrays and methods for operating integrated circuit devices are provided. In an embodiment, an integrated circuit includes a selected column of bit cells, in which each bit cell in the selected column is coupled to a source line and is coupled to a bit line. Further, the integrated circuit includes a first column of bit cells laterally adjacent the selected column, in which each bit cell in the first column is coupled to the source line. Also, the integrated circuit includes a second column of bit cells laterally adjacent the selected column, in which each bit cell in the second column is coupled to the bit line.

In another embodiment, a memory array is provided. In the memory array, a bit block is formed from a row of bit cells and has a first end and a second end. In the bit block, first pairs of laterally adjacent bit cells are coupled to shared source lines and second pairs of laterally adjacent bit cells are coupled to shared bit lines. The memory array further includes a first dummy bit cell adjacent the first end of the bit block and a second dummy bit cell adjacent the second end of the bit block.

In another embodiment, a method for operating an integrated circuit device is provided. The method includes providing an array of bit cells including a selected column of bit cells located between a first adjacent column of bit cells and a second adjacent column of bit cells. In the selected column, each bit cell is coupled to a source line SL1 and to a bit line BL1. In the first adjacent column, each bit cell is coupled to the source line SL1 and to a bit line BL0. In the second adjacent column, each bit cell is coupled to a source line SL2 and to the bit line BL1. Further, a row is formed from a first bit cell in the selected column, a first bit cell in the first adjacent column, and a first bit cell in the second adjacent column. The method further includes activating a word line to turn ON an access transistor in each bit cell in the row, turning OFF the bit line BL0 and the source line SL2, and turning ON the bit line BL1 and the source line SL1.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
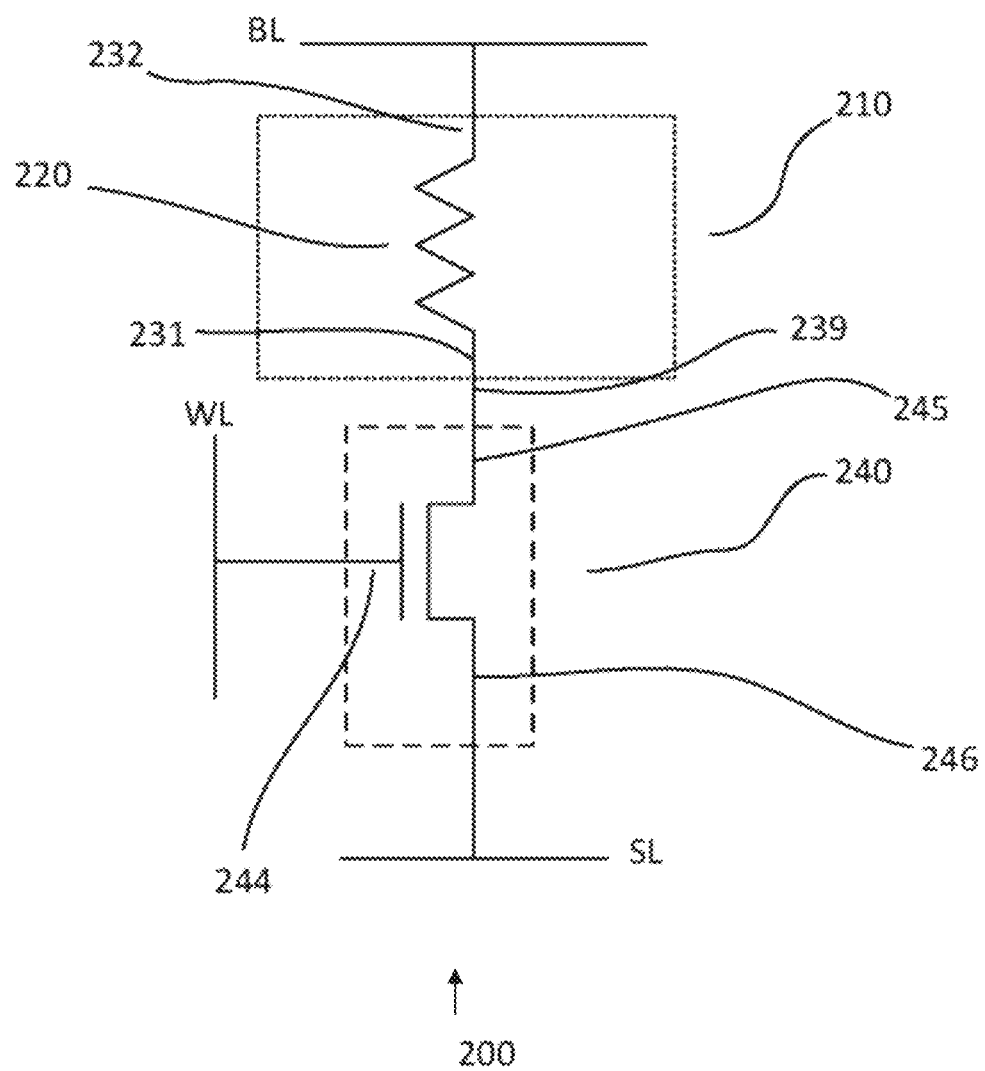
FIG. 1 is a schematic diagram of an embodiment of a magnetic memory cell in accordance with an embodiment herein.

The following detailed description is merely exemplary in nature and is not intended to limit the integrated circuits, memory arrays and methods for operating integrated circuit devices. Furthermore, there is no intention to be bound by any expressed or implied theory presented in the preceding technical field, background or brief summary, or in the following detailed description.

For the sake of brevity, conventional techniques related to conventional device layout and fabrication may not be described in detail herein. Moreover, the various tasks and processes described herein may be incorporated into a more comprehensive procedure or process having additional functionality not described in detail herein. In particular, various techniques in semiconductor layout and fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when a first element or layer is referred to as being "over" or "under" a second element or layer, the first element or layer may be directly on the second element or layer, or intervening elements or layers may be present. When a first element or layer is referred to as being "on" a second element or layer, the first element or layer is directly on and in contact with the second element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

Embodiments of the present disclosure generally relate to magneto-resistive memory cells such as spin transfer torque magneto-resistive random access memory (STT-MRAM) cells. Further, embodiments herein relate to the coupling of memory cells from pairs of columns to shared bit lines and from other pairs of columns to shared source lines in order to reduce the amount of chip area and height used by arrays of such memory cells.

FIG. 1 is a simplified schematic diagram of an embodiment of a memory cell 200. The memory cell 200 is a non-volatile memory cell, for example, a magneto-resistive memory cell, such as a spin transfer torque-magneto-resistive random access memory (STT-MRAM) cell. Other suitable types of memory cells may also be useful. As shown, the memory cell 200 includes a magnetic storage unit 210 and a cell selector unit 240. The magnetic storage unit 210 is coupled to the cell selector unit 240 at a first cell node 239 of the memory cell 200. The exemplary magnetic storage unit 210 includes a magnetic tunnel junction (MTJ) element 220.

The exemplary MTJ element 220 includes a first electrode 231 and a second electrode 232. The first electrode 231, for example, may be a bottom electrode while the second electrode 232 may be a top electrode. Other configurations of electrodes may also be useful. In one embodiment, the top electrode 232 of the MTJ element 220 is electrically connected to a bit line BL and the bottom electrode 231 is electrically connected to the first cell node 239. As described below, an MTJ element in a first adjacent memory cell in a common or same row but different column is electrically connected to the same bit line BL, such that the bit line is shared by two adjacent memory cells in the same row.

In FIG. 1, the exemplary cell selector unit 240 is an access transistor for selecting the memory cell 200. In one embodiment, the access transistor 240 is a metal oxide semiconductor (MOS) transistor, such as an n-type MOS transistor, and includes a gate or control terminal 244, a first source/drain (S/D) terminal 245, and a second source/drain (S/D) terminal 246. The first S/D terminal 245 may be referred to as the drain and the second S/D terminal 246 may be referred to as the source. It is noted that while the access transistor 240 may be a planar device, such as planar semiconductor-over-insulator (SOI) device, access transistor 240 may also be formed as a FINFET device, a gate all around (GAA) device, or with another suitable structure.

In an embodiment, the first S/D terminal 245 of the access transistor 240 and first electrode 231 of the MTJ element 220 are commonly coupled at the first cell node 239, i.e., the drain terminal 245 of the access transistor 240 is coupled to the bottom electrode 231 of the MTJ element 220. In such embodiment, the second or source terminal 246 of the access transistor 240 is coupled to a source line SL while the gate terminal 244 is coupled to a word line WL. As described below, an access transistor in a second adjacent memory cell in a common or same row but different column is electrically connected to the same source line SL, such that the source line is shared by two adjacent memory cells in the same row.

Figure 2:
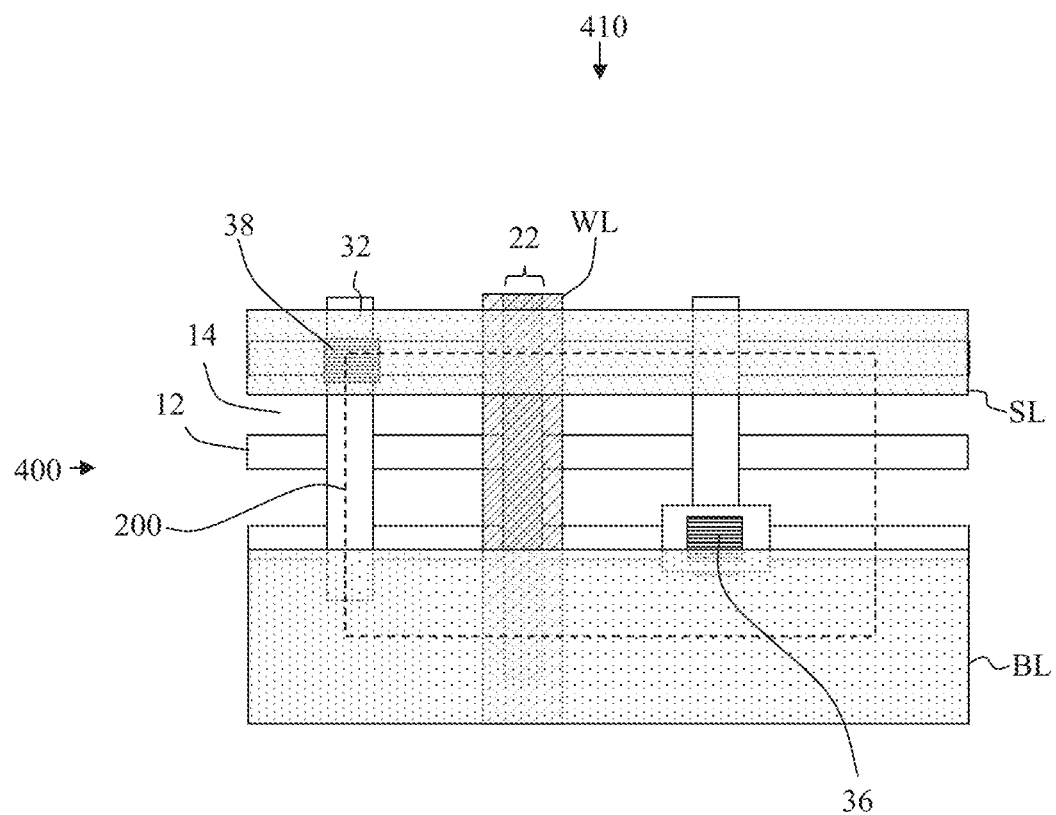
FIG. 2 is a cell layout view of the magnetic memory cell of FIG. 1 in accordance with an embodiment herein.

FIG. 2 is a schematic layout diagram of an embodiment of the memory cell 200 of FIG. 1. In FIG. 2, an exemplary memory cell 200 is an MRAM cell, such as a STT-MRAM cell. Other suitable types of memory cells may also be useful. In the orientation of the layout of FIG. 2, the memory cell 200 lies in a row 410 extending in a vertical or longitudinal direction (in the direction of word line WL) and lies in a column 400 extending in a horizontal or lateral direction (in the direction of bit line BL and source line SL.

In the exemplary layout of FIG. 2, the memory cell 200 is formed from parallel linear-shaped diffusion fins 12, i.e. FINFET devices. As shown, the linear, parallel fins 12 protrude from diffusion regions 14 in the substrate. The diffusion regions 14 and fins 12 together form source/drain active regions. The memory cell 200 also includes a linear gate electrode 22 that extends in a direction perpendicular to the fins 12. In an exemplary embodiment, the linear gate electrodes 22 wrap over the fins 12 and are electrically isolated from the fins 12 by a gate oxide material (not shown). Various contacts are oriented perpendicular to the fins 12 and parallel to the gate electrodes 22, for example interconnect structures 32 for connections to source/drain voltages, which may be part of the metal 1 (M1) layer. As shown, a bit line contact 36 couples the memory cell 200 to the bit line BL and a source line contact 38 couples the memory cell 200 to the source line SL in accordance with the circuitry described in FIG. 1.

Figure 3:
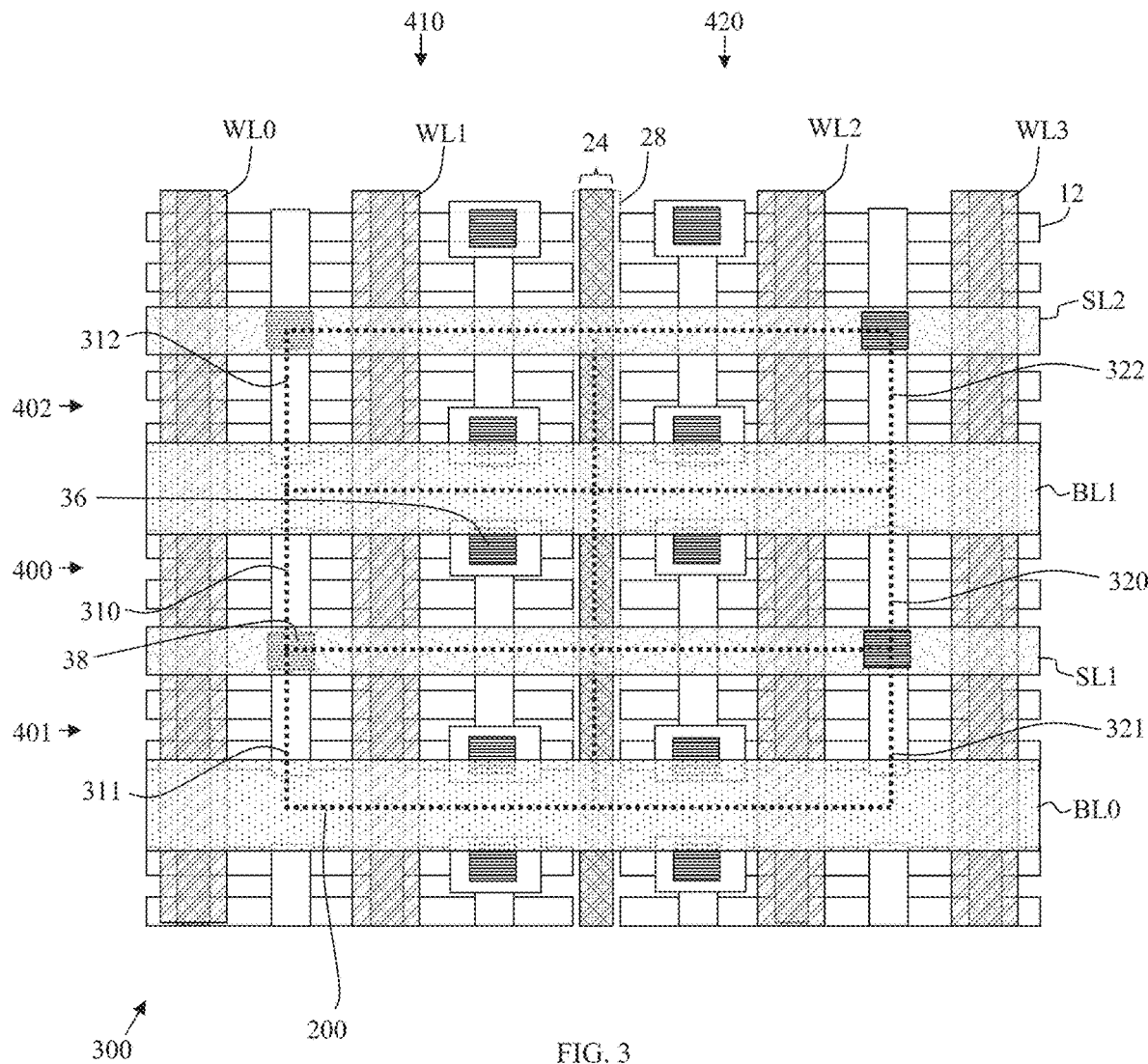
FIG. 3 is a cell layout view of an array of magnetic memory cells, as illustrated in FIG. 2, in accordance with an embodiment herein.

FIG. 3 is a cell layout for an array 300 of memory cells 200 as described in FIG. 2. As shown, the array 300 is arranged with memory cells 200 in columns 400, 401 and 402 extending in a lateral direction and in rows 410 and 420 extending in a vertical direction. For purposes of simplicity and clarity, column 400 may be referred to herein as selected column 400, column 401 may be referred to herein as first adjacent column 401, and column 402 may be referred to herein as second adjacent column 402. The terms "selected", "first adjacent", and "second adjacent" have no particular importance beyond identifying the spatial relationship between columns 400, 401 and 402.

As shown, the memory array 300 includes six expressly labeled and addressable memory cells 200 (310, 311, 312, 320, 321, 322) arranged in a 3×2 array, i.e., the memory array 300 is arranged to form three columns (400, 401 and 402) and two rows (410 and 420) of memory cells 200. Although the memory array 300 is illustrated as a 3×2 array, it is understood that arrays of other sizes may also be useful.

Memory cells 200 are individually identified as memory cell 310, memory cell 311, and memory cell 312 in row 410 and as memory cell 320, memory cell 321, and memory cell 322 in row 420. Likewise, memory cell 310 and memory cell 320 are located in selected column 400, memory cell 311 and memory cell 321 are located in first adjacent column 401, and memory cell 312 and memory cell 322 are located in second adjacent column 402.

Figure 4:
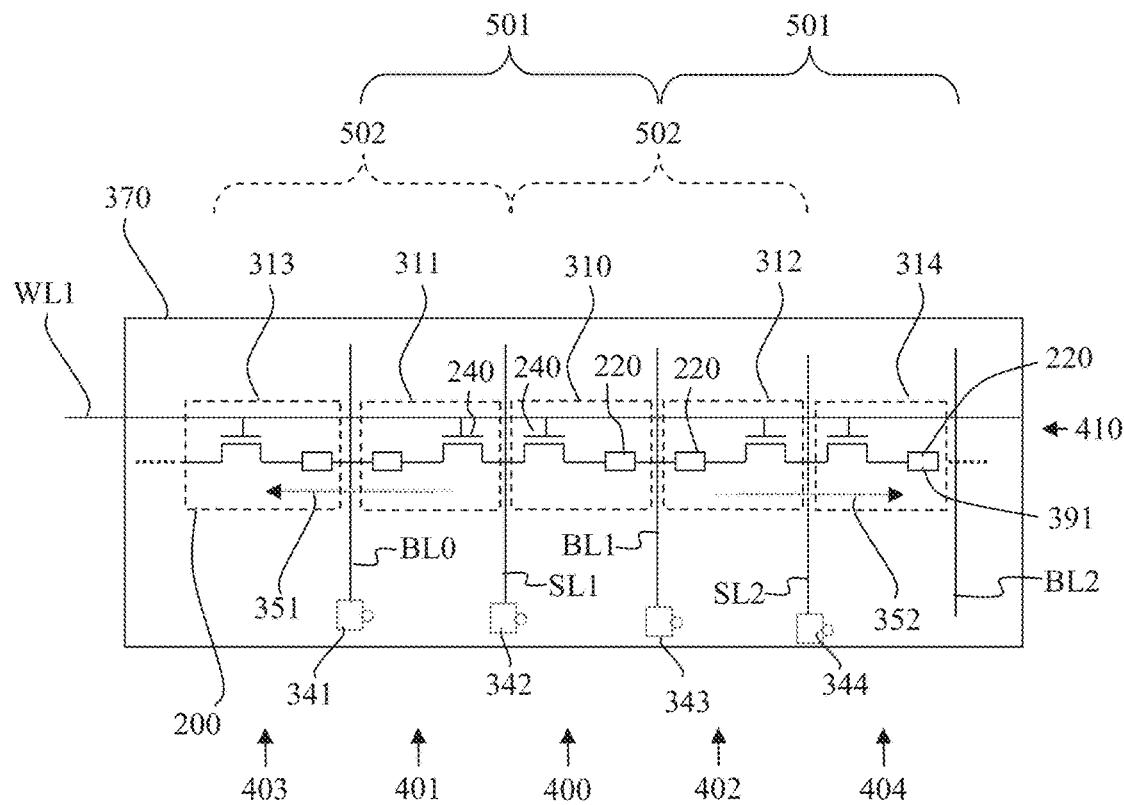
FIG. 4 is a schematic diagram of a bit block formed by memory cells of FIG. 3 in accordance with an embodiment herein.

In addition to the components described in FIG. 2, the array 300 of memory cells 200 is provided with a dummy gate 24 that is formed at the vertical boundary between laterally adjacent memory cells 200 in the orientation of FIG. 4, i.e., between rows 410 and 420 or in other words between adjacent memory cells 200 within a same column 400, 401 or 402. For example, the dummy gate 24 is formed between memory cell 310 and memory cell 320, between memory cell 311 and memory cell 321, and between memory cell 312 and memory cell 322.

Further, the array 300 includes an active region cut 28 that separates the fins 12 and active areas between each pair of adjacent cells 200 at the boundary along the dummy gate 24, i.e., between rows 410 and 420 or in other words between memory cell 310 and memory cell 320, between memory cell 311 and memory cell 321, and between memory cell 312 and memory cell 322. The active region cut 28 forms a single diffusion break (SDB) to isolate adjacent memory cells 200 within a same column 400, 401 or 402 from one another.

As shown in FIG. 3, the array 300 is provided with a plurality of parallel word lines, such as word lines WL0, WL1, WL2 and WL3, a plurality of parallel bit lines, such as bit lines BL0 and BL1, and a plurality of source lines, such as source lines SL1 and SL2. As shown, the word lines lie over the gate electrodes and are perpendicular to the bit lines and source lines.

In array 300, bit line contacts 36 couple memory cell 310 to bit line BL1, memory cell 311 to bit line BL0, memory cell 312 to bit line BL1, memory cell 320 to bit line BL1, memory cell 321 to bit line BL0, and memory cell 322 to bit line BL1. Further, source line contacts 38 couple memory cell 310 to source line SL1, memory cell 311 to source line SL1, memory cell 312 to source line SL2, memory cell 320 to source line SL1, memory cell 321 to source line SL1, and memory cell 322 to source line SL2.

FIG. 4 provides a schematic diagram of memory cells 200 from row 410 of the array 300 in FIG. 3. As shown in FIG. 4, memory cell 310 is located directly between first adjacent memory cell 311 and second adjacent memory cell 312. Also illustrated are next-adjacent memory cells 313 and 314. These memory cells 200 are illustrated as being indicative of adjacent memory cells in the array 300 of FIG. 3. It is noted that the orientation of FIG. 4 is conventional, with columns 400, 401, 402, 403 and 404 extending vertically, in the direction of bit lines BL0 and BL1 and source lines SL1 and SL2, and with row 410 extending horizontally, in the direction of word line WL1.

In FIG. 4, the row 410 of adjacent memory cells 200 forms a bit block 370. Further, memory cells 310 and 311 form a first pair 501 of laterally adjacent memory cells 200 and first pair 501 of laterally adjacent columns 400 and 401. The laterally adjacent memory cells 200 in each first pair 501 share a source line. For example, memory cell 310 and memory cell 311 are each coupled to and share source line SL1. Similarly, memory cells 312 and 314 form another first pair 501 of laterally adjacent bit cells 200 and first pair 501 of laterally adjacent columns 402 and 404. As can be seen, memory cells 312 and 314 are each coupled to and share source line SL2. Bit block 370 may include any suitable number of first pairs 501 of laterally adjacent memory cells 200.

As shown, memory cells 310 and 312 form a second pair 502 of laterally adjacent memory cells 200 and second pair 502 of laterally adjacent columns 400 and 402. Each second pair 502 of laterally adjacent memory cells 200 share a bit line. For example, memory cell 310 and memory cell 312 are each coupled to and share bit line BL1. Similarly, memory cells 311 and 313 form another second pair 502 of laterally adjacent memory cells 200 and second pair 502 of laterally adjacent columns 401 and 403. As can be seen, memory cells 311 and 313 are each coupled to and share bit line BL0. Bit block 370 may include any suitable number of second pairs 502 of laterally adjacent memory cells 200, corresponding to the number of first pairs 501 of laterally adjacent memory cells 200. For example, an exemplary bit block 370 may include N active bit cells, where N is a total number of active bit cells. Each bit cell 200 in the bit block 370 shares a bit line, therefore, the bit block 370 includes ½ N shared bit lines. Further, bit block 370 includes alternating first and second pairs 501 and 502, as memory cells 200 alternatingly share bit lines or source lines.

In FIG. 4, each memory cell 200 is a magneto-resistive random access memory (MRAM) bit cell including a magnetic tunnel junction (MTJ) element 220 and an access transistor 240 as described in FIG. 1. As shown in FIG. 4, each access transistor 240 is coupled to a respective source line, and each MTJ element 220 is coupled to a respective bit line. For example, for selected bit cell 310, the access transistor 240 is coupled to source line SL1 and the MTJ element 220 is coupled to bit line BL1.

It is noted that adjacent bit cells 200 are arranged in a mirrored layout. For example, the access transistor 240 of the first adjacent bit cell 311 is next to the access transistor 240 of the selected bit cell 310 and is also coupled to source line SL1. Likewise, the MTJ element 220 of the second adjacent bit cell 312 is next to the MTJ element 220 of the selected bit cell 310 and is also coupled to bit line BL1. This arrangement of shared bit lines and source lines continues throughout the row of bit cells 200 in the bit block 370. With the described arrangement, it can be seen that a bit block may include in sequence a bit line BL0, MTJ element, transistor, source line SL1, transistor, MTJ element, bit line BL1, MTJ element, transistor, source line SL2, transistor, MTJ element, bit line BL2, and so on.

Therefore, as seen in FIG. 4, the selected bit cell 310 is coupled to source line SL1 and to bit line BL1; first adjacent bit cell 311 is coupled to source line SL1 and to bit line BL0; and second adjacent bit cell 312 is coupled to source line SL2 and to bit line BL1.

In FIG. 4, the bit lines and source lines BL0, SL1, BL1, and SL2 are further coupled to column select (transmission gate) switches 341, 342, 343 and 344, respectively. This arrangement allows for a method for storing and accessing individual bit cells, without corrupting other stored bit cells despite sharing both a source line and a bit line. For example, to access bit cell 310, switches 341 and 344 are turned OFF and switches 342 and 343 are turned ON, and word line WL1 is activated. Despite the fact that the access transistors 240 in all of the bit cells 200 are ON, there is no static current path in the direction of arrow 351 or arrow 352 because switches 341 and 344, coupled to bit line BL0 and source line SL2 respectively, are OFF. Thus, it may be seen that a selected bit cell 200, such as bit cell 310, can be accessed in a read or write operation despite sharing the both a source line (with a first adjacent bit cell) and a bit line (with a second adjacent bit cell).

Figure 5:
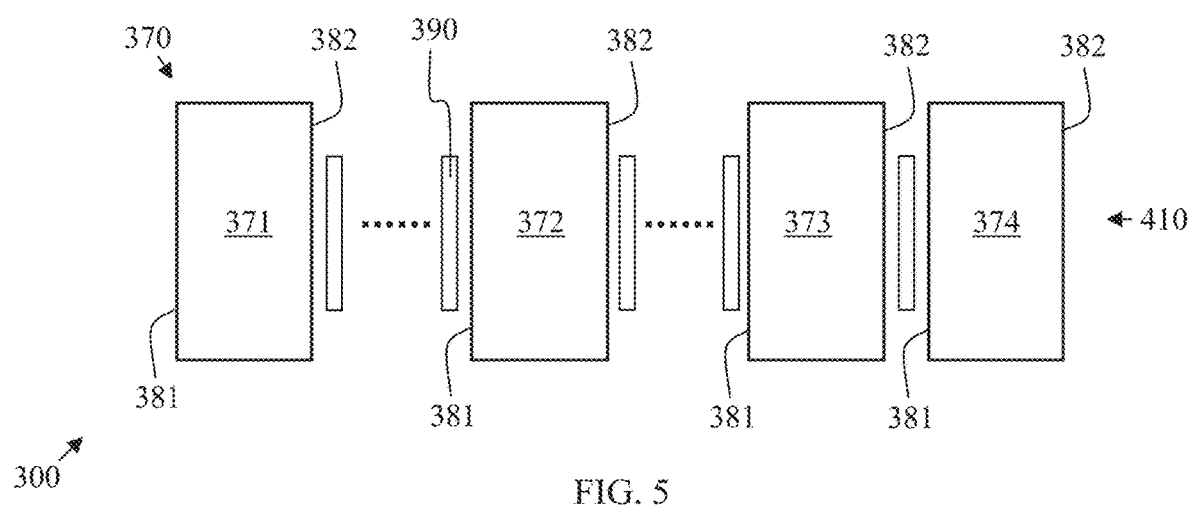
FIG. 5 is a schematic diagram of a plurality of bit blocks isolated from one another in accordance with an embodiment herein.

Therefore, the possibility that adjacent bit-cells might be disturbed during an operation is mitigated by ensuring that only the SL and BL of the selected bit is ON and all other source lines and bit lines are OFF. However, this structure would be limited to only allowing a read or write operation of one bit from an array. FIG. 4 illustrates how to access an individual selected bit cell in a bit block 370. In FIG. 5 access of a word (or a set of bits together) is explained.

In general, it is necessary to read or write an entire word (for example, eight bits). As described herein, reading and writing entire words is provided for by discontinuing or interrupting the array by adding dummy cells. As a result, one bit may be read from each continuous section, but there are multiple independent, i.e., non-continuous, sections due to selective placement of dummy cell. As such, one bit can be read from each of the independent sections forming the entire word, for example, from eight sections.

In summary, the OFF pass gates prevent any disturb in the bit-cells within a same section, while dummy cells provide for multiple independent sections that can be read or written simultaneously.

As noted, FIG. 5 describes the access of a word (or a set of bits together). As shown, the array 300 of memory cells is broken into several bit blocks 370 including a high-order or most significant bit (MSB) block 371, a selected number of blocks represented by $n^{th}$ block 372, a $1^{st}$ block 373, and a $0^{th}$ block 374. Bit blocks 370 may be located in row 410, for example. Each bit block 370 has a first end 381 and a second end 382.

In FIG. 5, adjacent blocks 370 are independent of one another. In other words, while bit cells in a bit block 370 may share a source line or bit line, bit cells in one block 370 are isolated from the bit cells in adjacent blocks 370. Adjacent blocks 370 may be isolated or separated by forming a dummy column 390 between the ends 381 and 382 of respective blocks 370. For example, a dummy column 390 may be formed by skipping, or leaving open, an MTJ via in the column 390 between the two adjacent blocks 370. In other words, a dummy bit is formed between the adjacent blocks 370. As a result, the regularity of the array 300 remains intact, yet the continuity between blocks 370 is broken.

Cross referencing FIG. 5 with FIG. 4, it may be envisioned that memory cell 314 is not formed as part of bit block 370, but is instead a dummy bit, i.e., an inactive bit cell. To form cell 314 as a dummy bit, MTJ element 220 may be formed without an electrical connection to bit line BL2 and thus serve as a dummy bit 391. For example, while other MTJ-vias are filled with conductive material to couple MTJ elements 220 to respective bit lines, the MTJ-via to the dummy MTJ element 391 in memory cell 314 may be filled with insulator or otherwise electrically disconnected from bit line BL2. As a result, MTJ element 391 is open, i.e., electrically disconnected from any and all bit lines. A dummy bit may be similarly formed at the other end of bit block 370.

In an exemplary embodiment, in the bit blocks 370 of FIG. 5, the words are stored in a bit-interleaved fashion. Specifically, all the MSBs of the words are stored in one block, i.e., block 373, the next MSBs are stored in adjacent block, e.g., block 372, and so on. By having several such blocks 370, one bit can be read from each block. These bits together will form an entire word, allowing for one word access per cycle.

To read an exemplary bit cell 200, such as bit cell 310, from memory array 300 of FIGS. 3 and 4, control voltages are applied such that bit line BL1 is an enabled bit line, source line SL1 is an enabled source line, and a high voltage is placed on word line WL1. In the present example, operations can therefore include placing a high voltage on bit line BL1, and a low voltage on source line SL1. The result is a read current passing from bit line BL1, through the bit cell 310, and through source line SL1, for example, to ground. Although WL1 activates all the bit-cells 310, 311, 312, 313 and 314, only the bit-cell 310 has both its access transistor 240 in an on state and the corresponding transmission gates 343 and 342 on. Assuming the BL1 is pulled to appropriate read voltage, a static read current can only flow through the bit-cell 310 and the on transmission gate 342. Sensing this current flow will allow reading the data stored in the bit-cell 310.

To write a "1" to bit cell 310, word line WL1 is high, bit line BL1 is low, and source line SL1 high. Word line WL1 being "high" means an enabling voltage in the word line switch of the bit cell 310. The result is a write current passing from source line SL1, through the bit cell 310 and to bit line BL1. To write a "0", the relative polarity of bit line BL1 and source line SL1 may be reversed. It will be understood that the assignment of logical "0" and logical "1" is arbitrary, so the described relative polarities of bit line BL1 and source line SL1 may be reversed.

As described herein, memory arrays with shared bit lines and shared source lines, and integrated circuits including such arrays are provided. Further, methods for operating such memory arrays or integrated circuits are described, in which individual bits and/or individual words may be stored and accessed without corrupting other stored bits or words. By sharing source lines and bit lines, memory arrays may be fabricated while using less chip area and height than those formed according to conventional processing.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof

What is claimed is:

1. An integrated circuit comprising:
   a selected column of bit cells, wherein each bit cell in the selected column is coupled to a source line and coupled to a bit line and wherein a first bit cell in the selected column is coupled to a word line;
   a first column of bit cells laterally adjacent the selected column, wherein each bit cell in the first column is coupled to the source line and wherein a first bit cell in the first column is coupled to the word line; and
   a second column of bit cells laterally adjacent the selected column, wherein each bit cell in the second column is coupled to the bit line and wherein a first bit cell in the second column is coupled to the word line;
   wherein each bit cell includes a magneto-resistive random access memory (MRAM) device;

wherein a first MRAM device in the selected column is longitudinally adjacent a second MRAM device in the selected column; and wherein a single diffusion break isolates the first MRAM device in the selected column from the second MRAM device in the selected column.

2. The integrated circuit of claim 1 wherein each MRAM device includes an access transistor.

3. The integrated circuit of claim 1 wherein each MRAM device includes an access transistor, and wherein the access transistor is a FINFET device.

4. The integrated circuit of claim 1 wherein each MRAM device includes an access transistor, and wherein the access transistor is a planar SOI device.

5. The integrated circuit of claim 1 wherein each MRAM device includes an access transistor, and wherein the access transistor is a gate all around (GAA) device.

6. An integrated circuit comprising:
a selected column of bit cells, wherein each bit cell in the selected column is coupled to a source line and coupled to a bit line and wherein a first bit cell in the selected column is coupled to a word line;
a first column of bit cells laterally adjacent the selected column, wherein each bit cell in the first column is coupled to the source line and wherein a first bit cell in the first column is coupled to the word line; and
a second column of bit cells laterally adjacent the selected column, wherein each bit cell in the second column is coupled to the bit line and wherein a first bit cell in the second column is coupled to the word line; wherein:
the first bit cell in the selected column is coupled to a first word line;
a second bit cell in the selected column is coupled to a second word line; and
a single diffusion break isolates the first bit cell in the selected column from the second bit cell in the selected column.

7. The integrated circuit of claim 1 wherein each bit cell includes an access transistor and a magnetic tunnel junction (MTJ) element, wherein:
the access transistor of each bit cell in the first column is directly adjacent to the access transistor of each respective bit cell in the selected column; and
the MTJ element of each bit cell in the second column is directly adjacent to the MTJ element of each respective bit cell in the selected column.

8. The integrated circuit of claim 1 wherein:
each bit cell in the selected column is coupled to source line SL1 and coupled to bit line BL1;
each bit cell in the first column is coupled to the source line SL1 and coupled to a bit line BL0; and
each bit cell in the second column is coupled to a source line SL2 and coupled to the bit line BL1.

9. The integrated circuit of claim 8 wherein source line SL1, source line SL2, bit line BL0 and bit line BL1 are each independently coupled to respective switches.

10. An integrated circuit comprising:
a selected column of bit cells, wherein each bit cell in the selected column is coupled to a source line and coupled to a bit line and wherein a first bit cell in the selected column is coupled to a word line;
a first column of bit cells laterally adjacent the selected column, wherein each bit cell in the first column is coupled to the source line and wherein a first bit cell in the first column is coupled to the word line; and
a second column of bit cells laterally adjacent the selected column, wherein each bit cell in the second column is coupled to the bit line and wherein a first bit cell in the second column is coupled to the word line;
wherein a block includes a first bit cell in the selected column, a first bit cell in the first column, and a first bit cell in the second column, and wherein the block is isolated from adjacent blocks by dummy magnetic tunnel junction (MTJ) elements.

11. An integrated circuit comprising:
a selected column of bit cells, wherein each bit cell in the selected column is coupled to a source line and coupled to a bit line and wherein a first bit cell in the selected column is coupled to a word line;
a first column of bit cells laterally adjacent the selected column, wherein each bit cell in the first column is coupled to the source line and wherein a first bit cell in the first column is coupled to the word line; and
a second column of bit cells laterally adjacent the selected column, wherein each bit cell in the second column is coupled to the bit line and wherein a first bit cell in the second column is coupled to the word line; wherein:
a first bit block comprises a row of first bit cells including the first bit cell in the selected column, the first bit cell in the first column, and the first bit cell in the second column,
the integrated circuit further includes a first inactive bit cell and second inactive bit cell, wherein the first bit block is located between the first inactive bit cell and the second inactive bit cell.

12. A memory array comprising:
a bit block formed from a row of bit cells, wherein first pairs of laterally adjacent bit cells are coupled to shared source lines and second pairs of laterally adjacent bit cells are coupled to shared bit lines, and wherein the bit block has a first end and a second end;
a first dummy bit cell adjacent the first end of the bit block; and
a second dummy bit cell adjacent the second end of the bit block.

13. The memory array of claim 12 wherein each bit cell in the bit block is a magneto-resistive random access memory (MRAM) bit cell including a magnetic tunnel junction (MTJ) element and an access transistor.

14. The memory array of claim 13 wherein MTJ elements in the bit block are coupled to respective shared bit lines and access transistors in the bit block are coupled to respective shared source lines.

15. The memory array of claim 13 wherein each dummy bit cell is formed by an MTJ element disconnected from any bit line.

16. The memory array of claim 12 wherein:
a designated first pair of laterally adjacent bit cells includes a first bit cell and a selected bit cell, wherein the first bit cell and the selected bit cell are coupled to a first shared source line; and
a designated second pair of laterally adjacent bit cells includes the selected bit cell and a second bit cell, wherein the selected bit cell and the second bit cell are coupled to a first shared bit line.

17. The memory array of claim 12 wherein the bit block comprises N active bit cells, wherein N is a total number of active bit cells, coupled to ½ N shared bit lines.

18. A method for operating an integrated circuit device, the method comprising:
providing an array of bit cells including a selected column of bit cells located between a first adjacent column of bit cells and a second adjacent column of bit cells, wherein:

each bit cell in the selected column is coupled to a source line SL1 and to a bit line BL1;
each bit cell in the first adjacent column is coupled to the source line SL1 and to a bit line BL0;
each bit cell in the second adjacent column is coupled to a source line SL2 and to the bit line BL1; and
a row is formed from a first bit cell in the selected column, a first bit cell in the first adjacent column, and a first bit cell in the second adjacent column;
activating a word line to turn ON an access transistor in each bit cell in the row;
turning OFF the bit line BL0 and the source line SL2; and
turning ON the bit line BL1 and the source line SL1.

* * * * *